US012813301B2

(12) United States Patent
Furukawa

(10) Patent No.: US 12,813,301 B2
(45) Date of Patent: Nov. 24, 2026

(54) SEMICONDUCTOR PACKAGE INCLUDING INNER LEAD PORTIONS HAVING BULGING ISLAND PORTIONS

(71) Applicant: SONY SEMICONDUCTOR SOLUTIONS CORPORATION, Kanagawa (JP)

(72) Inventor: Eiichi Furukawa, Kumamoto (JP)

(73) Assignee: SONY SEMICONDUCTOR SOLUTIONS CORPROATION, Kanagawa (JP)

( * ) Notice: Subject to any disclaimer, the term of this patent is extended or adjusted under 35 U.S.C. 154(b) by 445 days.

(21) Appl. No.: 18/551,438

(22) PCT Filed: Mar. 16, 2022

(86) PCT No.: PCT/JP2022/011765

§ 371 (c)(1),
(2) Date: Sep. 20, 2023

(87) PCT Pub. No.: WO2022/209881

PCT Pub. Date: Oct. 6, 2022

(65) Prior Publication Data

US 2024/0170388 A1 May 23, 2024

(30) Foreign Application Priority Data

Mar. 30, 2021 (JP) ................................ 2021-058029

(51) Int. Cl.
*H10W 70/65* (2026.01)
*H10W 72/00* (2026.01)
(Continued)

(52) U.S. Cl.
CPC ...... *H10W 70/65* (2026.01); *H10W 72/07552* (2026.01); *H10W 72/527* (2026.01); *H10W 90/754* (2026.01)

(58) Field of Classification Search
CPC ... H01L 23/49838; H01L 23/15; H01L 23/13; H01L 24/48; H01L 24/49; H10W 70/65;
(Continued)

(56) References Cited

U.S. PATENT DOCUMENTS 4,477,828 A * 10/1984 Scherer ................ H10W 76/60 257/E23.189
4,769,272 A * 9/1988 Byrne .................... H01L 23/10 428/209
(Continued)

FOREIGN PATENT DOCUMENTS

EP 0300434 A2 * 1/1989 .......... H10W 70/668
EP 1237187 A2 * 9/2002 .......... H10W 74/111
(Continued)

OTHER PUBLICATIONS

International Search Report and Written Opinion of PCT Application No. PCT/JP2022/011765, issued on Jun. 21, 2022, 09 pages of ISRWO.

*Primary Examiner* — Ida M Soward
(74) *Attorney, Agent, or Firm* — CHIP LAW GROUP

(57) ABSTRACT

Provided is a semiconductor package that increases the degree of freedom in wiring arrangement and enables wiring layout of various bonding wires. The semiconductor package includes a package main body portion, a bed portion which is provided on a center side of the package main body portion and on which a semiconductor chip is mounted, and an inner lead portion formed in a plurality of turns to surround a periphery of an outer edge side of the bed portion, the inner lead portion establishing connection with the semiconductor chip.

5 Claims, 6 Drawing Sheets

(51) Int. Cl.
*H10W 72/50* (2026.01)
*H10W 90/00* (2026.01)

(58) Field of Classification Search
CPC ............... H10W 70/68; H10W 70/692; H10W 72/07552; H10W 72/527; H10W 72/50; H10W 90/754
See application file for complete search history.

(56) References Cited

U.S. PATENT DOCUMENTS

| | | | | | |
|---|---|---|---|---|---|
| 5,091,772 | A * | 2/1992 | Kohara | H01L 24/85 | 257/784 |
| 5,491,362 | A * | 2/1996 | Hamzehdoost | H10W 76/157 | 257/713 |
| 5,796,170 | A * | 8/1998 | Marcantonio | H05K 1/0218 | 257/E23.067 |
| 5,814,883 | A * | 9/1998 | Sawai | H10W 76/12 | 257/E23.105 |
| 5,972,736 | A * | 10/1999 | Malladi | H10W 76/47 | 257/676 |
| 5,986,334 | A * | 11/1999 | Lee | H01L 23/24 | 257/667 |
| 6,060,779 | A * | 5/2000 | Machii | H01L 23/24 | 257/730 |
| 6,323,065 | B1 * | 11/2001 | Karnezos | H01L 23/36 | 257/E23.101 |
| 2001/0006828 | A1 * | 7/2001 | McMahon | H10W 90/401 | 438/109 |
| 2003/0001244 | A1 * | 1/2003 | Araki | H10P 72/74 | 257/E23.037 |
| 2003/0162319 | A1 * | 8/2003 | Crane, Jr. | H10W 70/479 | 438/106 |
| 2003/0178723 | A1 * | 9/2003 | Ito | H10W 70/027 | 257/E23.048 |
| 2004/0080026 | A1 * | 4/2004 | Minamio | H10W 74/019 | 257/E21.504 |
| 2004/0262752 | A1 * | 12/2004 | Ito | H10W 70/424 | 257/734 |
| 2005/0006735 | A1 * | 1/2005 | an Tatt | H10W 70/421 | 257/691 |
| 2005/0189627 | A1 * | 9/2005 | Ito | H10W 74/111 | 257/E21.504 |
| 2005/0258519 | A1 * | 11/2005 | Kikuchi | H10W 72/701 | 257/E23.129 |

FOREIGN PATENT DOCUMENTS

| | | | | | |
|---|---|---|---|---|---|
| JP | 07-321160 | A | | 12/1995 | |
| JP | H1187399 | A | * | 3/1999 | H01L 23/50 |
| JP | 2000-077595 | A | | 3/2000 | |
| JP | 2002261228 | A | * | 9/2002 | H01L 23/3107 |
| JP | 2005-243694 | A | | 9/2005 | |
| JP | 2009-212211 | A | | 9/2009 | |
| JP | 2021-044458 | A | | 3/2021 | |
| TW | 200425450 | A | * | 11/2004 | H10W 74/111 |
| WO | WO-9303871 | A1 | * | 3/1993 | H01L 23/66 |
| WO | 2005/024933 | A1 | | 3/2005 | |

* cited by examiner

SEMICONDUCTOR PACKAGE INCLUDING INNER LEAD PORTIONS HAVING BULGING ISLAND PORTIONS

CROSS REFERENCE TO RELATED APPLICATIONS

This application is a U.S. National Phase of International Patent Application No. PCT/JP2022/011765 filed on Mar. 16, 2022, which claims priority benefit of Japanese Patent Application No. JP 2021-058029 filed in the Japan Patent Office on Mar. 30, 2021. Each of the above-referenced applications is hereby incorporated herein by reference in its entirety.

TECHNICAL FIELD

The present disclosure relates to a semiconductor package that can be used for, for example, a dual inline ceramic package, a quand flat package, a ball grid alley suitable for high integration with high terminal density, and the like, and particularly relates to a semiconductor package including an inner lead capable of wiring connection with a semiconductor chip having a large number of high-density terminals.

BACKGROUND ART

Recently, semiconductor devices have been used for various applications in a wide range of fields along with miniaturization and high integration of electronic circuits, terminals, and the like. For this reason, various packages for semiconductor chip mounting corresponding to downsizing, thinning, cost reduction, increase in pins, and the like have been developed.

The package used for these semiconductor devices, for example, the frame is dedicated for each product application, and a wide variety of packages are provided. Then, in a case where the specification of the product is changed or the product is redesigned, for example, the terminal position of the semiconductor chip is moved or the bonding position of the wire for wiring is changed without changing the frame itself (see, for example, Patent Document 1).

In the above-described semiconductor device, since a large number of wirings are provided, when the arrangement of the connection wirings is changed, for example, in the case of performing cross bonding or the like in which wires are connected in a crossed state, the bonding wire length becomes long, and thus there is a problem that the wires are in contact with each other or in contact with the semiconductor chip.

Therefore, there has been proposed a semiconductor device capable of changing a terminal position and the number by arranging inner leads side by side along a terminal of a semiconductor chip (see, for example, Patent Document 2).

CITATION LIST

Patent Document

Patent Document 1: Japanese Patent Application Laid-Open No. 2000-77595

Patent Document 2: Japanese Patent Application Laid-Open No. 2005-243694

SUMMARY OF THE INVENTION

Problems to be Solved by the Invention

In the semiconductor device described in Patent Document 2, as seen in the last embodiment, at the time of connecting the terminal on the semiconductor chip side and the inner lead, the degree of freedom in wiring from the terminal to the inner lead is increased by a certain extra length secured in the inner lead.

However, since the outer lead and the inner lead are configured to be fixed in a predetermined 1:1 correspondence relationship, the degree of freedom in wiring is narrowed in that respect. Therefore, for example, the configuration of Patent Document 2 is difficult to cope with a semiconductor chip in which a large number of terminals are provided in a matrix form at high density.

In addition, in the structure of Patent Document 2, a portion (bed portion) on which a semiconductor chip is mounted needs to be laid out before resin sealing.

An object of the present disclosure is to provide a semiconductor package that increases the degree of freedom of wiring arrangement and enables a wiring layout of various bonding wires that can cope with a case where a semiconductor chip to be mounted has a high-density terminal.

Solutions to Problems

The present disclosure has been made to achieve the above object, and a first aspect thereof is a semiconductor package including: a package main body portion; a bed portion which is provided on a center side of the package main body portion and on which a semiconductor chip is mounted; and an inner lead portion formed in a plurality of turns to surround a periphery of an outer edge side of the bed portion, the inner lead portion including a plurality of inner leads for establishing connection with the semiconductor chip.

In the first aspect, a plurality of the inner leads may be disposed in a spiral shape to surround a periphery of the semiconductor chip.

Further, in the first aspect, each of the inner leads has an island portion bulging laterally with respect to a wiring direction at a plurality of locations.

Further, in the first aspect, each of the inner leads is arranged side by side in a rectangular shape in a plurality of turns around four sides of outer edge sides of the bed portion having a substantially rectangular shape, and each of the inner leads has a configuration in which an entire length in each winding is:

- formed over an entire of the four outer edge sides of the bed portion;
- formed over three sides of the outer edge sides of the bed portion;
- formed over two sides of the outer edge sides of the bed portion; or
- formed in units of each side of the outer edge sides of the bed portion.

Furthermore, in the first embodiment, the island portion may have any one of a circular shape, an elliptical shape, a rhombus shape, and a rectangular shape.

Further, in the first embodiment, the package main body portion is constituted by ceramic.

A semiconductor package according to the present disclosure includes: a bed portion on which a semiconductor chip disposed on a center side of a package main body is mounted; and an inner lead portion formed in a plurality of turns so as to surround a periphery of an outer edge side of the bed portion, the inner lead portion including a plurality of inner leads for establishing connection with the semiconductor chip. Therefore, when wiring connection is performed from the semiconductor chip to the inner lead portion, wiring connection can be freely performed from the semiconductor chip toward the inner lead portion in each direction without any limitation on the inner lead portion from any direction and any place in the periphery of the outer edge portion of the bed portion.

In addition, similarly, in a case where the wiring is drawn out from the inner lead portion to the outer lead or the like outside, the wiring can be drawn out from any direction and any place of the inner lead portion. Therefore, even when terminals are formed at high density on the semiconductor chip mounted on the bed portion, wiring connection and wiring drawing can be performed corresponding to these terminals.

BRIEF DESCRIPTION OF DRAWINGS

FIGS. 5A, 5B, 50, and 5D are explanatory diagrams illustrating arrangements of inner lead portions of various configuration examples according to the present embodiment.

MODE FOR CARRYING OUT THE INVENTION

Figure 1A:
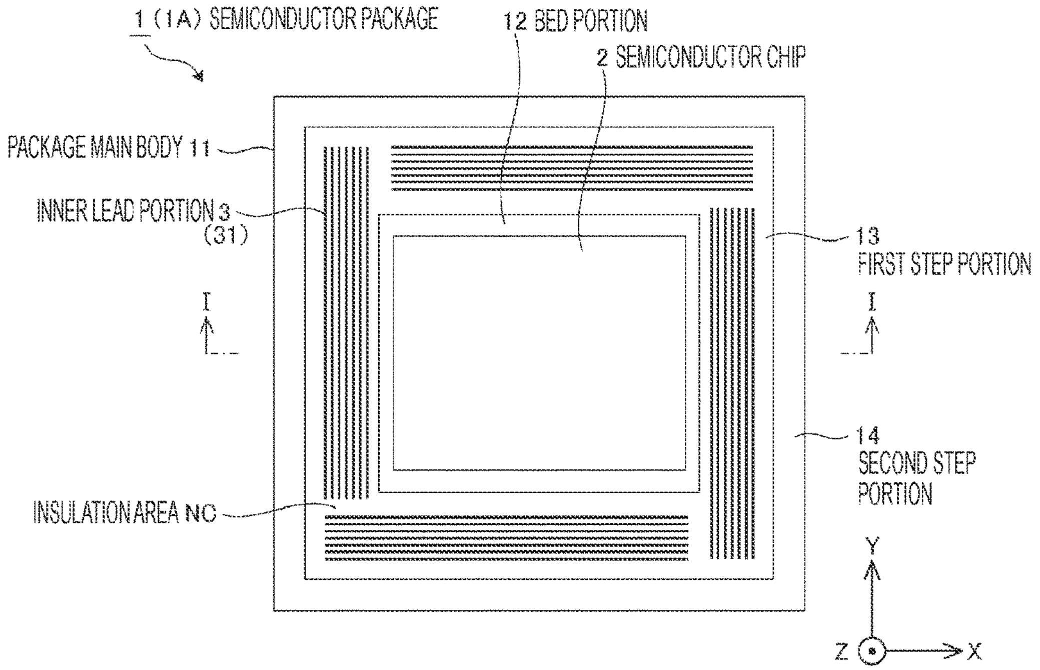
FIG. 1A is a schematic plan view illustrating a semiconductor package according to a first embodiment of the present disclosure.

Hereinafter, modes for carrying out technology of the present disclosure (hereinafter described as "embodiments") will be described in detail with reference to the drawings. The technology of the present disclosure is not limited to that of each embodiment, and various numerical values, materials, and the like in each embodiment are examples. In the following description, the same reference numerals are used for the same elements or elements having the same functions, and redundant description will be omitted. Note that the description is given in the following order.

1. Semiconductor Package According to Embodiment of Present Disclosure
1-1. First Configuration Example . . . Installation of I-Shaped Inner Lead Portion at Four Locations
1-2. Second Configuration Example . . . Installation of U-Shaped Inner Lead Portion at One Location
1-3. Third Configuration Example . . . Installation of L-Shaped Inner Lead Portion at Two Locations
1-4. Fourth configuration example . . . Installation of Inner Lead Portions in Which I-Shaped Parts Form Pair at Four Locations <1. Ceramic Package Structure of Semiconductor According to Embodiment of Present Disclosure>

Figure 1B:
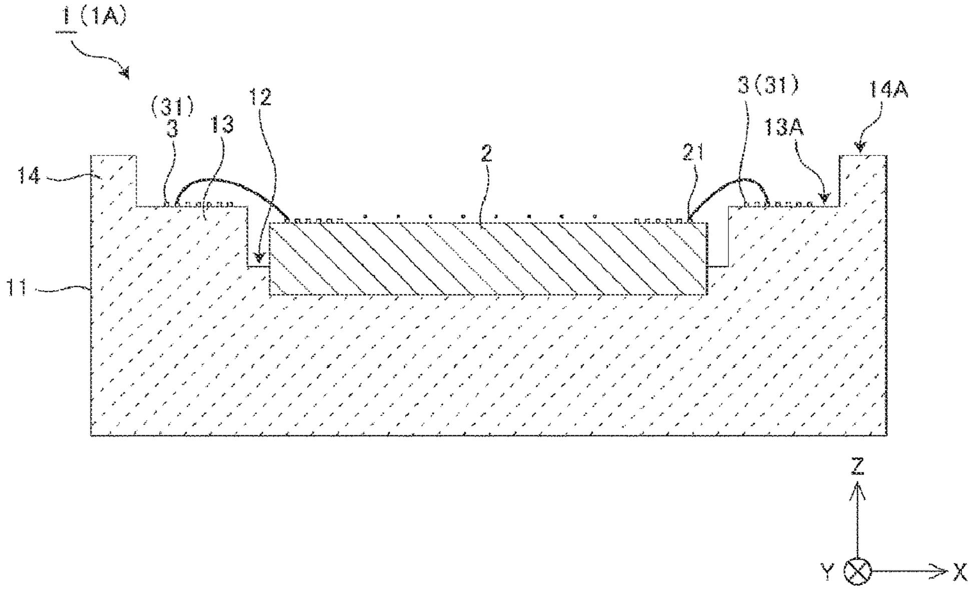
FIG. 1B is a schematic cross-sectional view taken along line I-I of FIG. 1A.

FIG. 1A is a schematic plan view schematically illustrating a semiconductor package according to an embodiment of the present disclosure, and FIG. 1B is a schematic cross-sectional view taken along line I-I in FIG. 1A. Note that, in each of the following drawings according to the present embodiment, three-dimensional Cartesian coordinates of a right-handed system in which three directions orthogonal to each other are indicated by X, Y, and Z are also illustrated in order to clearly illustrate the shapes and the arrangement state of the structure, but the position of the origin is not particularly specified.

[Configuration of Semiconductor Ceramic Package]

In a semiconductor package 1 according to the present embodiment, a package main body portion 11 has, for example, a laminated structure formed by laminating a plurality of thin ceramic sheets constituted by a ceramic material such as alumina having high insulation properties and a small thermal expansion coefficient. In this package main body portion 11, a semiconductor chip 2 and an inner lead portion 3 are formed as a substantial configuration.

Note that the package main body 11 of the present embodiment is formed by laminating a large number of ceramic sheet materials containing alumina having high electrical insulation properties as a main raw material, but is not particularly limited to this ceramic sheet material. In addition, the forming material is not particularly limited to a material containing the alumina as a main raw material, and aluminum nitride or other materials having high thermal conductivity can be used.

In the present embodiment, the package main body portion 11 has a step shape having a substantially three-step cross-sectional structure from the central portion toward the periphery. The package main body portion 11 includes a substantially rectangular or square bed portion 12 provided at a central portion for mounting the semiconductor chip 2, a first step portion 13 provided one step higher in a step shape so as to surround the periphery of the outer edge portion of the bed portion 12 for installing the inner lead portion 3, and a second step portion 14 provided one step higher in a step shape outside the first step portion 13 so as to further surround the first step portion 12.

In addition, when wiring connection between the semiconductor chip 2 and the outside is completed, specifically, for example, wiring connection between the semiconductor chip 2 and the inner lead 3 and wiring connection between the inner lead 3 and an outer lead (not illustrated) or the like is completed, and then the package main body portion 11 is molded with an appropriate resin to perform resin sealing. Note that, instead of the resin sealing, the package main body portion 11 may be sealed from above with a lid portion (not illustrated) prepared in advance constituted by an appropriate metal.

The bed portion 12 has a substantially rectangular shape or a square shape whose vertical and horizontal sizes are slightly larger than the outer shape of the mounted semiconductor chip 2, and is fixed in a state where a part (lower portion side) of the semiconductor chip 2 is embedded.

The first step portion 13 is formed in a square shape in plan view, and as described above, the inner lead portion 3 including a plurality of inner leads 31 is disposed in the first step portion 13.

Similarly to the first step portion 13, the second step portion 14 has a square shape, and is provided one step higher around the first step portion 13 so as to surround the first step portion 13. Therefore, for example, in a case where the wiring connection between the outer lead portion (not illustrated) and the inner lead portion 3 is performed, a gold wire (Au wire) or the like can be wired by a wire bonder or the like in a state of going over the second step portion 14.

Figure 2:
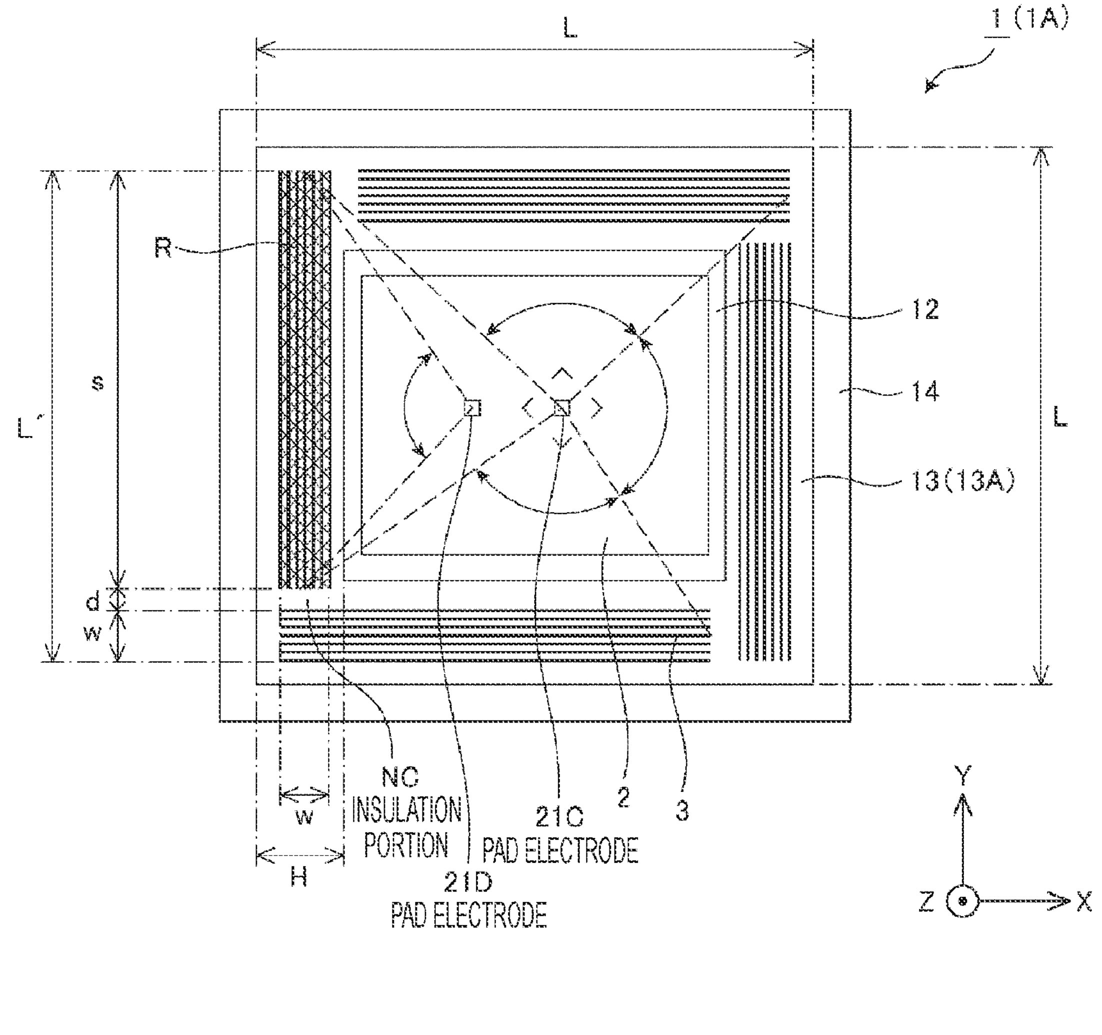
FIG. 2 is an explanatory diagram illustrating a wiring area in a standard layout of a semiconductor chip and an inner lead portion in the semiconductor package illustrated in FIGS. 1A and 1B.

The semiconductor chip 2 of the present embodiment is mounted and fixed in a state where the lower half is embedded in the bed portion 12. On the upper surface of the semiconductor chip 2, as illustrated in FIG. 2, a large number of (72 in the present embodiment) bonding pads (hereinafter, may be referred to as a "pad electrode") 21 having a rectangular shape or a square shape are formed in a high-density state in which the bonding pads are arranged in a matrix in the XY-two-dimensional direction.

The inner lead portion 3 can be electrically connected to a terminal of the semiconductor chip 2, that is, the pad electrode 21 by a wire bondender using, for example, a gold wire (Au wire) or the like. In particular, in the present disclosure, in order to enable wiring connection even in the semiconductor chip 2 having a large number of pad electrodes 21, four inner leads 31 each having an I-shape, in other words, a ribbon shape (hereinafter, this may be referred to as a "ribbon R") are provided on all sides along each side of an upper surface 13A portion having the square shape in plan view of the first step portion 13.

[Specific Configuration of Inner Lead Portion]

1-1. First Configuration Example

As illustrated in FIG. 2, the inner lead portion 3 (in the present configuration example, referred to as an "inner lead portion 3A") of the semiconductor package 1 (in the present configuration example, referred to as a "semiconductor package 1A") of the first configuration example according to the present embodiment is formed in a square-shaped pattern (hereinafter, may be referred to as a "frame pattern") similar to the upper surface 13A, in which the outer peripheral length of each side is L' and the width of each side is w, in the upper surface 13A of the square-shaped first step portion 13 having a constant length L and a constant width W.

That is, the inner lead portion 3A of the present configuration example is formed and disposed in this frame pattern by a conductive metal foil (gold foil in the present embodiment) or the like.

Note that, as a pattern shape of the inner lead portion 3A formed on the upper surface 13A, formation patterns of various modes can be used as described later. For example, in the inner lead portion 3A of the present configuration example, each inner lead 31 can be formed in a shape of a ribbon R having a length s and a width w along each side (length L) of the upper surface 13A as indicated by cross hatching in FIG. 2. That is, each inner lead 31 can be configured as a long rectangular (ribbon) shaped wiring connection conductor (hereinafter, this may be referred to as "ribbon R").

Figure 5A:
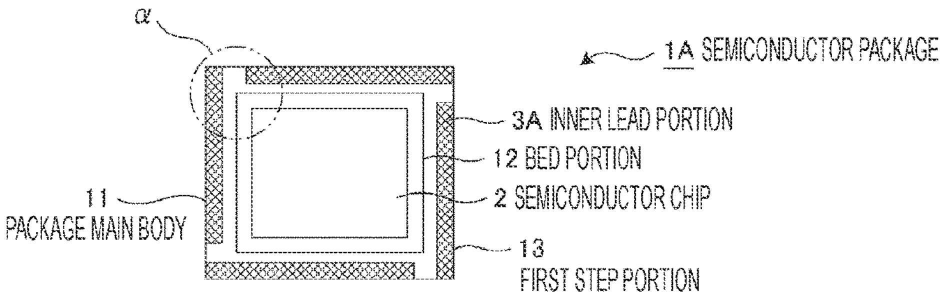

In other words, as illustrated in FIGS. 1A and 5A, for example, the inner lead portion 3A of the present configuration example can be configured by four ribbons R having the same shape, and can be sequentially arranged side by side in a cyclic manner by deflecting the direction by 90 degrees clockwise from each other on the upper surface 13A (see FIG. 1B) of the first step portion 13.

As illustrated in FIG. 2, the ribbons R have a complementary arrangement configuration in which a portion of the tip end side of the ribbon R next to each other enters by the width w in the shaded region (hereinafter, this may be referred to as an "insertion portion H"). Therefore, each of the ribbons R has a length s (where s<L') and a width w.

The length s of each of the ribbons R is obtained by subtracting the length w of the insertion portion H on the tip end portion side of the next ribbon R and the insulation area NC (=d). Specifically, in FIG. 2, each ribbon R has a length s (=L'−(w+d)) obtained by subtracting a sum of a length w of the insertion portion H entering on the tip end side of the adjacent ribbon R and a length d of the insulation area NC for achieving insulation with the adjacent ribbon R from a length L' of each side of the frame pattern.

Note that, as described above, the insulation area NC separates the adjacent ribbons R by a predetermined length (hereinafter, this may be referred to as a "cut portion D": see FIG. 4) to impart independence to the ribbons R. That is, by separating the ribbons R from the adjacent ribbons R, the upper surface 13A of the first step portion 13 constituted by a ceramic material such as alumina having high insulation properties and a small thermal expansion coefficient is interposed between the ribbons R, so that sufficient insulation can be secured.

Figure 6A:
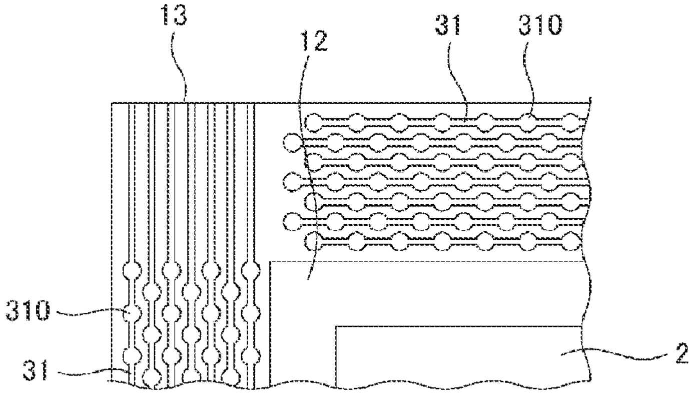
FIGS. 6A, 6B, and 6C are explanatory diagrams illustrating layouts of inner leads at a corner portion in an inner lead portion of various configuration examples according to the present embodiment.

Further, in the present configuration example, as an arrangement mode at the corner portion between the inner lead portions 3A, for example, an a portion in FIG. 5A can be arranged as illustrated in FIG. 6A.

In the present embodiment, the inner lead portion 3A provided on each side of the upper surface 13A is formed by arranging seven inner leads 31 in parallel to each other as illustrated in FIGS. 1A and 1B. The inner lead 31 can maintain a stable connection state by using the same metal as the wire material (hereinafter, this is referred to as a "bonding wire") to be bonded. Therefore, in the present embodiment, a gold wire (Au wire) is used for the bonding wire, and the same gold (Au) is also used for the inner lead 31 and formed on the upper surface 13A in a predetermined pattern shape.

In particular, in the present embodiment, the package main body portion 11 is formed by laminating a large number of thin ceramic sheets constituted by a ceramic material such as alumina having high insulation properties and a small thermal expansion coefficient, for example. Therefore, in the inner lead 31 according to the present embodiment, when the upper surface 13A of the first step portion 13 of the package main body portion 11 is formed, in at least the uppermost ceramic sheet of the first step portion 13 (further, depending on the thickness of the ceramic sheet, in a plurality of ceramic sheets below the ceramic sheet), a metal foil having good conductivity, for example, gold (Au) in the present configuration example, is formed with a predetermined wiring pattern determined in advance through a predetermined work process.

Figure 3:
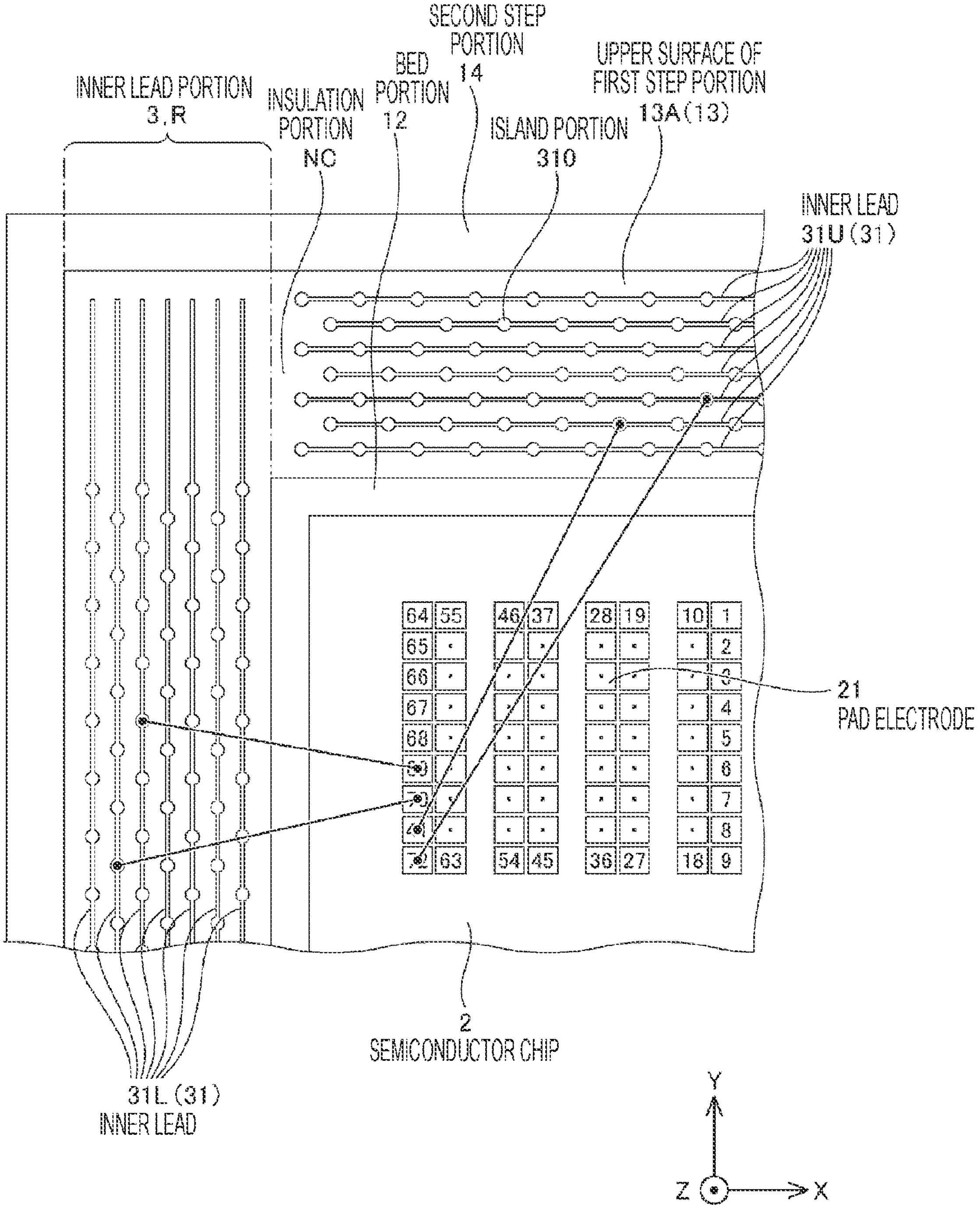
FIG. 3 is a schematic plan view illustrating a partial enlargement in the semiconductor package illustrated in FIGS. 1A and 1B.

Further, as illustrated in FIG. 3, the inner lead 31 of the present disclosure has a configuration in which island portions 310 bulging laterally with respect to the wiring direction are provided at a plurality of places at a required pitch interval. That is, in the inner lead 31, when the inner lead 31 and the pad electrode 21 on the semiconductor chip 2 side are connected, a large number of island portions 310 are formed in order to freely select a connection portion of the bonding wire, which is the lead-out wiring, in the inner lead 31.

These island portions 310 have a circular shape in the case of the present embodiment, but are not particularly limited to this shape, and may have any form of an elliptical shape, a rhombus shape, and a rectangular shape, or the like, for example. In addition, in order to reduce an installation space by narrowing an arrangement interval between the inner leads 31, the island portions 310 are formed in an arrangement state in which positions are shifted by a half pitch from each other so that the island portions 310 provided in the adjacent inner leads 31 do not collide with each other.

Note that the semiconductor package of the present disclosure is not particularly limited to a combination of a material such as gold wire for a bonding wire and gold foil for a pattern wiring as in this embodiment, and aluminum (Al), copper (Cu), or the like can be used for a bonding wire and a pattern wiring. For example, gold (Au) may be used for the bonding wire and aluminum (Al) may be used for the pattern wiring. In this case, when thermocompression bonding is performed with a wire bonder, an alloy layer is formed by a thermal reaction (gold aluminum reaction), so that firm connection can be performed.

Therefore, according to the present configuration example, for example, in FIG. 3, while the number of pad electrodes 21 of the semiconductor chip 2 is 72 (=9 rows×8 columns), the number of inner leads 31 is 28 (=7×4 locations) assuming seven at each of four locations of the upper, lower, left, and right. Therefore, it is necessary to connect approximately three bonding wires on average per one inner lead 31, the bonding wires being drawn one by one from each pad electrode 21. Therefore, in each inner lead 31, it is necessary to divide one inner lead 31 into three on average.

Therefore, such a case can be handled by the following method. This will be described with reference to FIG. 4.

Figure 4:
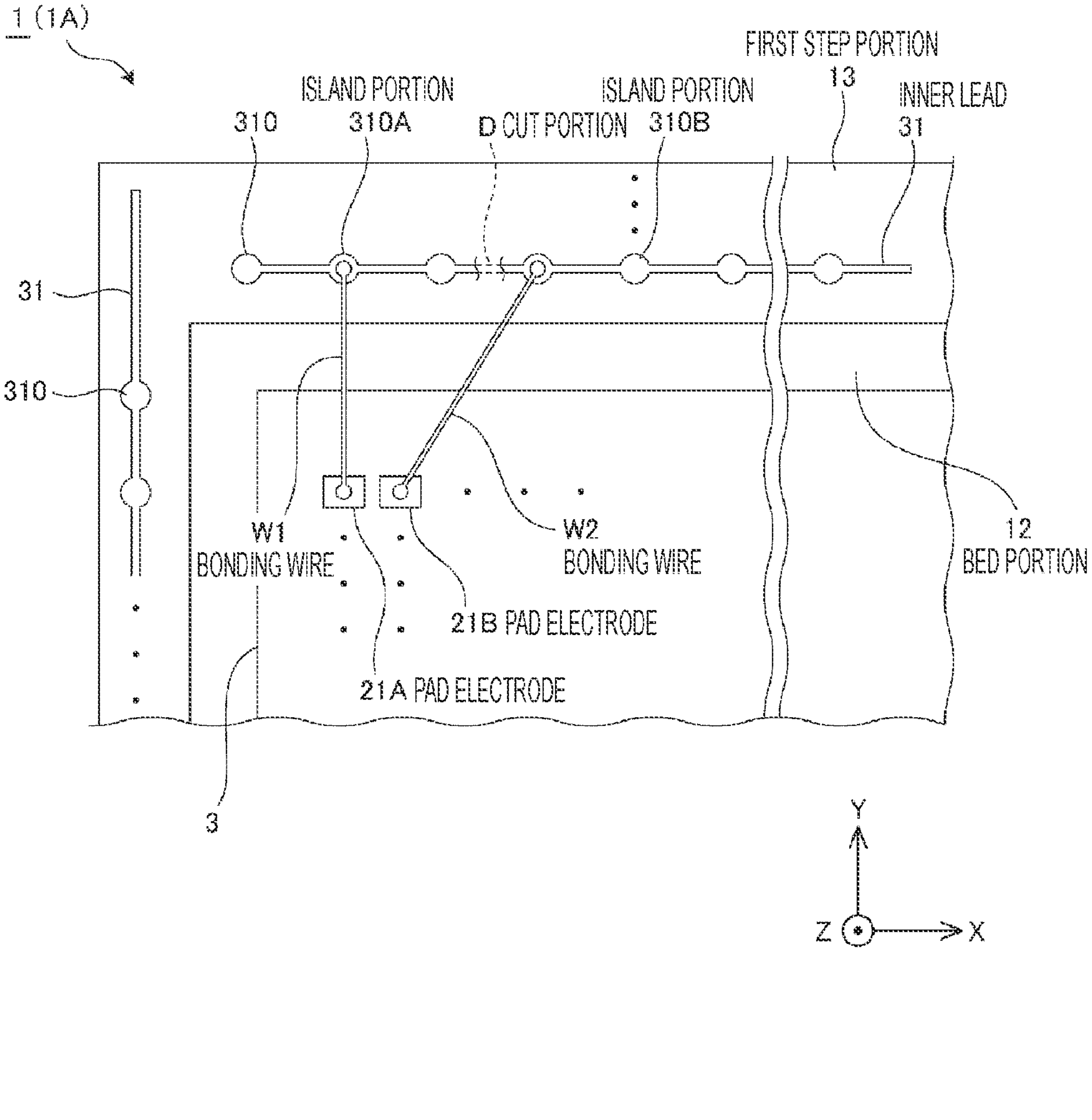
FIG. 4 is an explanatory diagram illustrating a specific connection state of bonding wires in the semiconductor package illustrated in FIGS. 1A and 1B.

For example, in FIG. 4, a tip end portion of a bonding wire W1 whose base end portion is connected to and wired with a pad electrode 21A of the semiconductor chip 3 is welded to the island 310A. Similarly, a tip end portion of a bonding wire W2 whose base end portion is connected to and wired with a pad electrode 21B of the semiconductor chip 3 is welded to the island 310B.

In this case, since the two pad electrodes 21A and 21B of the semiconductor chip 3 are electrically connected to the same inner lead 31, a connection failure occurs as it is. Therefore, in a case where the inner leads 31, which are the connection destinations on the tip end sides of two bonding wires W, are the same, it is necessary to discontinue the connection states of the two bonding wires W. Therefore, for example, a dedicated fusing means is provided in advance in a semiconductor manufacturing apparatus or the like, and as illustrated in FIG. 4, the cut portion D can be formed by fusing between the islands 310A and 310B of the inner lead 31. As a result, even in a case where a large number of bonding wires are connected to the same inner lead, it is possible to eliminate the imperfection of the connection state by partially forming the cut portion D.

Moreover, as in the present embodiment, since a large number of islands 310 are formed in a single inner lead 31, even in a case where the connection between the tip end side of the bonding wire W and an island 310 fails, it is possible to reconnect to another island 310.

As described above, as illustrated in FIG. 5A, the inner lead portion 3A of the present embodiment has a structure having a square shape in which four ribbons R are complementarily and sequentially arranged side by side in a cyclic manner along the periphery of four sides on the outer edge side of the bed portion 12 when viewed as an entire shape. In addition, the inner lead 31 constituting the inner lead portion 3A can also be said to have an arrangement structure in which the inner lead is wound in a plurality of layers concentrically (this may be referred to as a "spiral shape") along the periphery of the four sides on the outer edge side of the bed portion 12 when viewed as an entire shape.

Therefore, according to the semiconductor package of the present configuration example, when focusing on an arbitrary pad electrode 21 of the semiconductor chip 2, for example, as illustrated in FIG. 2, regarding a pad electrode 21C disposed in the substantially central portion of the semiconductor chip 2, the bonding wire drawn out from the pad electrode and wired and connected to the inner lead 31 can be easily wired and connected to any of the four ribbons R of the upper, lower, left, and right of the inner lead portion 3A.

On the other hand, for a pad electrode 21D provided on the upper side of the semiconductor chip 2 in FIG. 2, for example, avoiding the pad electrode in the substantially central portion of the semiconductor chip 2, the nearest ribbon R is on the left side or on the upper side as illustrated in FIG. 3, for example. Therefore, in this case, wiring connection with an arbitrary island portion 310 of a left inner lead 31L or an upper inner lead 31U is straightforward routing. In addition to this, wiring connection with the inner leads 31 of the ribbons R on the upper side, the right side, and the lower side is not impossible, and the inner leads 31 to be wired can be selected for those in all directions of approximately 360 degrees.

Note that, in the present embodiment, each inner lead 31 has a pattern structure in which the entire length is formed along each side on the outer edge side of the bed portion 12 in each winding to surround the entire four sides, but is not particularly limited to this pattern mode. For example, the pattern structure may be formed over three sides on the outer edge side of the bed portion 12, or two sets may be formed over two sides on the outer edge side of the bed portion 12. These various aspects will be described later.

1-2. Second Configuration Example

Next, an inner lead portion 3B of a second aspect (hereinafter referred to as a "second configuration example") according to the present disclosure will be described with reference to FIG. 5B. Note that, in the present configuration example, the same parts as those in the first configuration example are denoted by the same reference numerals, and redundant description is avoided.

In a semiconductor package 1B of the present configuration example, as illustrated in the drawing, two I-shaped inner lead portions 3B are arranged side by side at predetermined intervals along each side of the bed portion 12, and a total of eight inner lead portions 3B are formed.

Figure 5B:
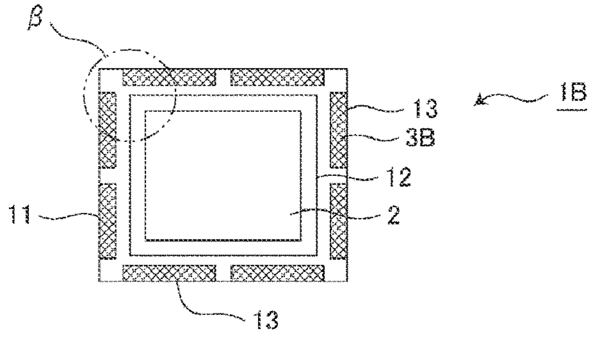
Figure 6B:
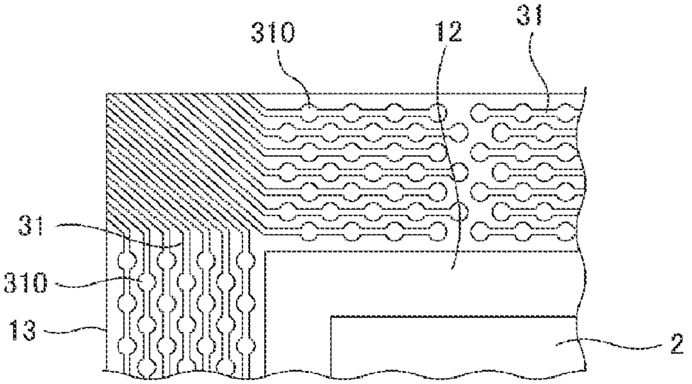

Further, in the present configuration example, as an arrangement mode at the corner portions between the inner lead portions 3B, for example, a β portion in FIG. 5B can be arranged as illustrated in FIG. 6B.

[Effects of Second Configuration Example]

Therefore, according to the present configuration, in a case where the bonding wire is drawn out from the pad electrode of the semiconductor chip 2 to the inner lead portion 3B, the number of the closest inner leads as connection targets is smaller than that of the first configuration example, but the total number of the inner leads is doubled, which is suitable for application to a semiconductor chip having a terminal with a higher density.

1-3. Third Configuration Example

Next, an inner lead portion 3C of a third aspect (hereinafter, referred to as a "third configuration example") according to the present disclosure will be described with reference to FIG. 5C. Note that, in the present configuration example, the same parts as those of the first and second configuration examples are denoted by the same reference numerals, and redundant description is avoided.

A semiconductor package 1C of the present configuration example is different from the first and second configuration examples in that the inner lead portion 3C is formed in a substantially L shape and is constituted by two components.

Figure 5C:
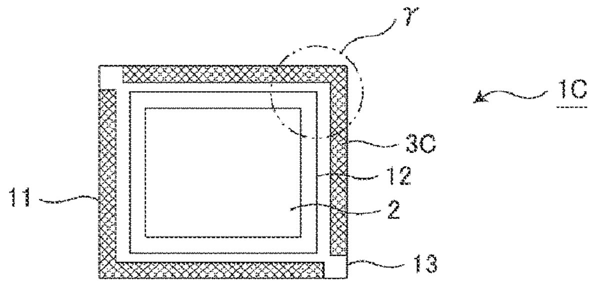
Figure 6C:
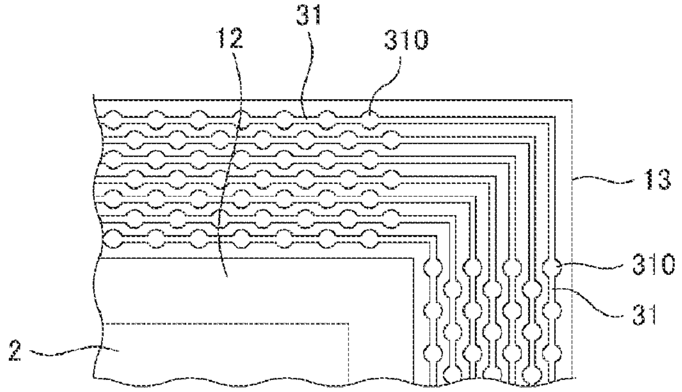

Further, in the present configuration example, as an arrangement mode at the corner portion between the inner lead portions 3C, for example, a γ portion in FIG. 5C can be arranged as illustrated in FIG. 6C.

[Effects of Third Configuration Example]

Therefore, according to the present configuration, in a case where the bonding wire is drawn out from the pad electrode of the semiconductor chip 2 to the inner lead portion 3B, the number of the closest inner leads as connection targets is 14 (=7×2 locations). Therefore, the total number of inner leads is smaller than that in the first and second configuration examples, but the closest inner lead as connection targets is expanded to the range of 180 degrees, and accordingly, the drawing direction of the inner lead as connection targets is twice as large as that in the first configuration example and 4 times as large as that in the second configuration example. As a result, the layout of the bonding wire is greatly expanded.

1-4. Fourth Configuration Example

Figure 5D:
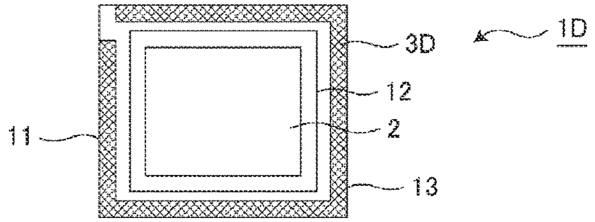

Next, an inner lead portion 3D of a fourth aspect (hereinafter, referred to as a "fourth configuration example") according to the present disclosure will be described with reference to FIG. 5D. Note that, also in the present configuration example, the same parts as those in the previous configuration examples are denoted by the same reference numerals, and redundant description is avoided.

The semiconductor package 1D of the present configuration example is different from the first to third configuration examples in that the inner lead portion 3D is formed in a substantially U shape and is constituted by a single component.

[Effects of Fourth Configuration Example]

Therefore, according to the present configuration, in a case where the bonding wire is drawn out from the pad electrode of the semiconductor chip 2 to the inner lead portion 3D, the number of inner leads as connection targets is seven. Therefore, the total number of inner leads is smaller than that in the first to third configuration examples. However, the inner lead as connection targets is enlarged over the entire circumference of approximately 360 degrees, and accordingly, the drawing direction to the inner lead is twice as large as that in the first configuration example, 4 times as large as that in the second configuration example, and twice as large as that in the third configuration example. As a result, the layout pattern of the bonding wire is greatly enlarged.

<3. Configuration that can be Taken by Present Disclosure>

It is to be noted that the technology of the present disclosure may have the following configurations.

(1) A semiconductor package including: a package main body portion; a bed portion which is provided on a center side of the package main body portion and on which a semiconductor chip is mounted; and an inner lead portion formed in a plurality of turns to surround a periphery of an outer edge side of the bed portion, the inner lead portion including a plurality of inner leads for establishing connection with the semiconductor chip.

(2) The semiconductor package according to (1), in which a plurality of the inner leads is disposed in a spiral shape to surround a periphery of the semiconductor chip.

(3) The semiconductor package according to (1) or (2), in which each of the inner leads has an island portion bulging laterally with respect to a wiring direction at a plurality of locations.

(4) The semiconductor package according to any one of (1) to (3), in which each of the inner leads is arranged side by side in a rectangular shape in a plurality of turns around four sides of outer edge sides of the bed portion having a substantially rectangular shape, and each of the inner leads has a configuration in which an entire length in each winding is: •formed over an entire of the four outer edge sides of the bed portion; •formed over three sides of the outer edge sides of the bed portion; •formed over two sides of the outer edge sides of the bed portion; or •formed in units of each side of the outer edge sides of the bed portion.

(5) The semiconductor package according to (3), in which the island portion has any one of a circular shape, an elliptical shape, a rhombus shape, and a rectangular shape.

(6) The semiconductor package according to any one of (1) to (5), in which the package main body portion is constituted by ceramic.

REFERENCE SIGNS LIST

1, 1A, 1B, 1C, 1D Semiconductor package
11 Package main body portion
12 Bed portion
13 First step portion
13A Upper surface
14 Second step portion
2 Semiconductor chip
21, 21A, 21B, 21C, 21D Bonding pad (pad electrode)
3, 3A, 3B, 3C, 3D Inner lead portion
31 Inner lead (wiring connection conductor: ribbon)
31L Left inner lead
31U Upper inner lead
310, 310A, 310B Island portion
D Cut portion
d Length of insulation area
H Insertion portion of next inner lead
L Length of upper surface of first step portion
L' Side length of each inner lead portion (including insertion
portion of next inner lead)
NC Insulation area
R Ribbon (wiring connection conductor)
s Length of inner lead
W, W1, W2 Bonding wire
w Inner lead width

The invention claimed is:

1. A semiconductor package, comprising:

a package main body portion;

a bed portion on a center side of the package main body portion;

a semiconductor chip mounted on the bed portion; and an inner lead portion that surrounds a periphery of an outer edge side of the bed portion, wherein the inner lead portion includes a plurality of inner leads configured to establish a connection with the semiconductor chip, each inner lead of the plurality of inner leads is an elongated strip-shaped wiring connection conductor having a length direction in which the elongated strip-shaped wiring connection conductor extends, the each inner lead of the plurality of inner leads has a plurality of island portions provided at a plurality of positions along the length direction, the plurality of island portions bulge laterally in a transverse direction perpendicular to the length direction, and the plurality of island portions in adjacent inner leads among the plurality of inner leads are offset from one another in the length direction such that the plurality of island portions of one inner lead of the plurality of inner leads do not collide with the plurality of island portions of an adjacent inner lead of the plurality of inner leads.

2. The semiconductor package according to claim 1, wherein the plurality of inner leads are in a spiral shape to surround a periphery of the semiconductor chip.

3. The semiconductor package according to claim 1, wherein the plurality of inner leads are arranged side by side in a rectangular shape or a square shape in a plurality of concentric layers, the plurality of concentric layers extend around four sides of outer edge sides of the bed portion having a substantially rectangular shape or a square shape, and the each inner lead has a configuration in which an entire length in each winding is:

over the four sides of the outer edge sides of the bed portion;

over three sides of the outer edge sides of the bed portion;

over two sides of the outer edge sides of the bed portion; or in units of each side of the outer edge sides of the bed portion.

4. The semiconductor package according to claim 1, wherein an island portion of the plurality of island portions has one of a circular shape, an elliptical shape, a rhombus shape, or a rectangular shape.

5. The semiconductor package according to claim 1, wherein the package main body portion is constituted by ceramic.

* * * * *